United States Patent
Wu et al.

(10) Patent No.: US 7,482,250 B2
(45) Date of Patent: Jan. 27, 2009

(54) METHOD FOR CUTTING PRINTED CIRCUIT BOARD

(75) Inventors: Tung-Zung Wu, Yun-Lin Hsien (TW); Kuo-Feng Yang, Taipei Hsien (TW); Chun-Chieh Huang, Taoyuan County (TW)

(73) Assignee: Nan Ya Printed Circuit Board Corporation, Luchu, Taoyuan (TW)

( * ) Notice: Subject to any disclaimer, the term of this patent is extended or adjusted under 35 U.S.C. 154(b) by 123 days.

(21) Appl. No.: 11/161,987

(22) Filed: Aug. 24, 2005

(65) Prior Publication Data

US 2006/0134888 A1 Jun. 22, 2006

(30) Foreign Application Priority Data

Dec. 20, 2004 (TW) .............................. 93139704 A

(51) Int. Cl.
*H01L 21/78* (2006.01)
(52) U.S. Cl. .................. 438/460; 438/113; 438/465
(58) Field of Classification Search ......... 438/460–465, 438/113, 114, 458
See application file for complete search history.

(56) References Cited

U.S. PATENT DOCUMENTS

| | | | | |
|---|---|---|---|---|
| 5,593,926 A | * | 1/1997 | Fujihira | 438/114 |
| 2005/0072596 A1 | * | 4/2005 | Lin | 174/262 |
| 2005/0161781 A1 | * | 7/2005 | Kanakubo | 257/678 |
| 2005/0250235 A1 | * | 11/2005 | Miles et al. | 438/48 |

FOREIGN PATENT DOCUMENTS

JP 6-170822 6/1994

* cited by examiner

*Primary Examiner*—Kevin M Picardat
(74) *Attorney, Agent, or Firm*—Winston Hsu

(57) ABSTRACT

A method for cutting a printed circuit board includes providing a printed circuit board including a cutting region having a plurality of metal conducting wires, disposing a patterned first protection layer on the printed circuit board surface and exposing the metal conducting wires in the cutting region, forming a conducting layer on a surface of the metal conducting wires, disposing a second protection layer on the cutting region, performing a cutting process in the cutting region, and removing the second protection layer.

14 Claims, 10 Drawing Sheets

METHOD FOR CUTTING PRINTED CIRCUIT BOARD

BACKGROUND OF THE INVENTION

1. Field of the Invention

The present invention relates to a method for cutting a printed circuit board, and more particularly, to a cutting method capable of reducing burrs in metal conducting wires and increasing the quality of printed circuit boards.

2. Description of the Prior Art

The window ball-grid-array (WBGA) package is a novel chip package technology. Connecting wires, which are drawn from a die, of a WBGA packaged memory pass through a window of a load board and connect with contact pads on the load board. Therefore, the connecting wires between the die and the load board are shortest of all of ball-grid-array (BGA) package technologies in existence such that the transmission speed is quicker and the inductance and the noise interference are smaller. For this reason, WBGA packaged memories are more suitable to be applied in a high frequency and high speed operation environment, and because of the short connecting wires WBGA packaged memories have lower power consumption and generate less heat. For instance, memories adopting the WBGA package technology have two to three times more memory capacity than other memories, which have the same size, and have better electric and heat conducting characteristics, so they are widely applied in portable products, for example, desktops and so forth.

A load board of a WBGA packaged memory is fabricated by using printed circuit board compatible processes, and windows of the load board and finished product separations are performed by utilizing cutting mills. FIG. 1 to FIG. 4 are schematic diagrams for illustrating a method for forming a window 26 by cutting a load board 10 of a WBGA packaged memory according to the prior art. As shown in FIG. 1, a substrate 12 is provided after an internal circuit process of the substrate 12 is finished. A plurality of metal conducting wires 14, 16, 18, 20, and 22 consisting of copper are formed on an upper and a lower surface of the substrate 12.

As shown in FIG. 2, a solder-resist ink layer 23 covers a portion of the metal conducting wires 14, 16, 18, 20, and 22. An exposure and development process are performed to increase an adhesive force between the solder-resist ink layer 23 and the metal conducting wires 14, 16, 18, 20, and 22 by light polymerization. As shown in FIG. 3, a conducting layer 24 is plated on the metal conducting wires 14, 16, 18, 20, and 22, which are not covered by the solder-resist ink layer 23. The conducting layer 24 consists of nickel (Ni) or gold (Au). As shown in FIG. 4, a cutting process is performed to form a window 26 by utilizing mill cutting on the substrate 12. The window 26 of a load board 10 of a WBGA packaged memory is finished.

According to the prior art, when a mill is used to cut the load board 10 of the WBGA packaged memory directly to form the window 26, burrs often result in edges where the metal conducting wires 14, 16, and 18 are cut, influencing the quality of the load board 10. In the past, the burrs are removed by laborers, hence manual labor is required and the quantity of output is influenced.

SUMMARY OF THE INVENTION

It is therefore an objective of the present invention to provide a method for cutting a printed circuit board to prevent metal conducting wires from having burrs and to increase the quality of the printed circuit board.

According to the objective of the present invention, the present invention provides a method for cutting a printed circuit board, which includes providing a printed circuit board including a cutting region having a plurality of metal conducting wires, disposing a patterned first protection layer on the printed circuit board surface and exposing the metal conducting wires in the cutting region, forming a conducting layer on a surface of the metal conducting wires, disposing a second protection layer on the cutting region, performing a cutting process in the cutting region, and removing the second protection layer.

Since the present invention utilizes the second protection layer to cover the cutting region and press against the metal conducting wires, burrs will be prevented while cutting. Furthermore, the second protection layer can be removed easily after the cutting process is finished. Therefore, the present invention is capable of increasing the quality of printed circuit boards, saving manual labor for removing burrs, and reducing the production cost.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
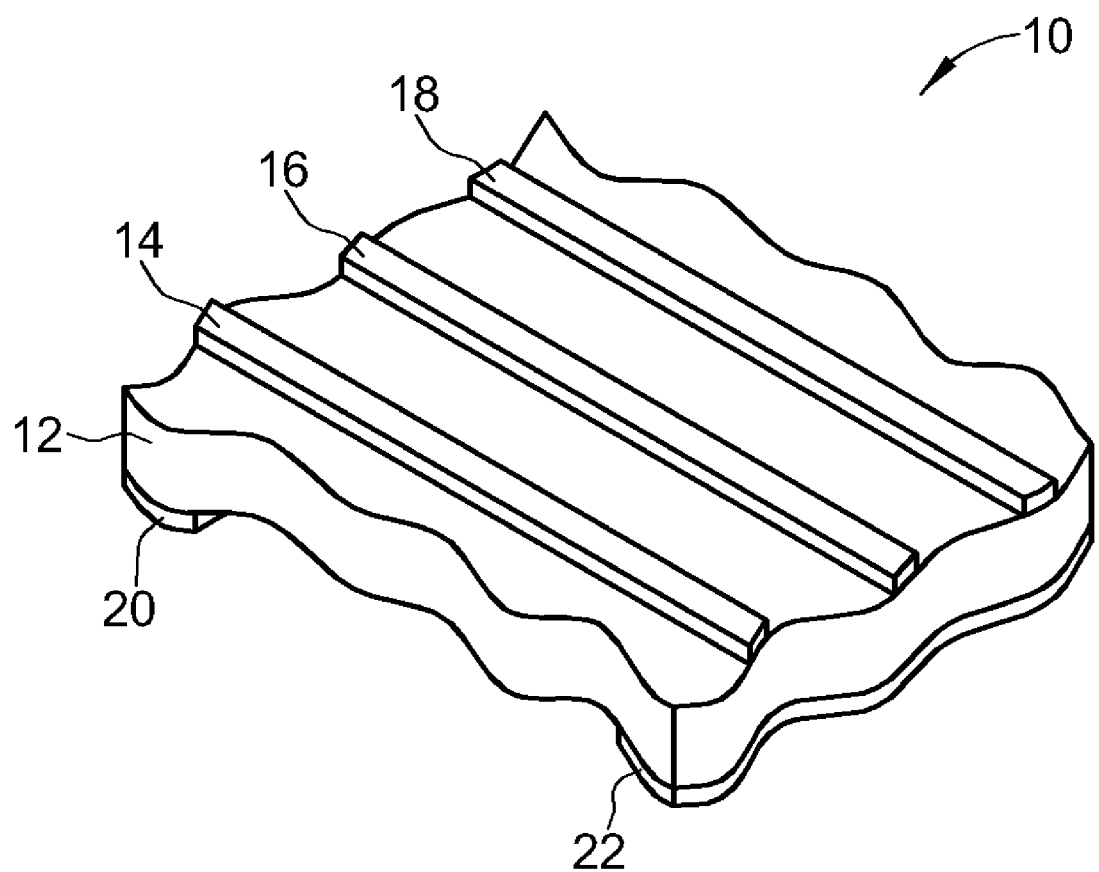
FIG. 1 to FIG. 4 are schematic diagrams for illustrating a method for forming a window by cutting into a load board of a WBGA packaged memory according to the prior art.
Figure 2:
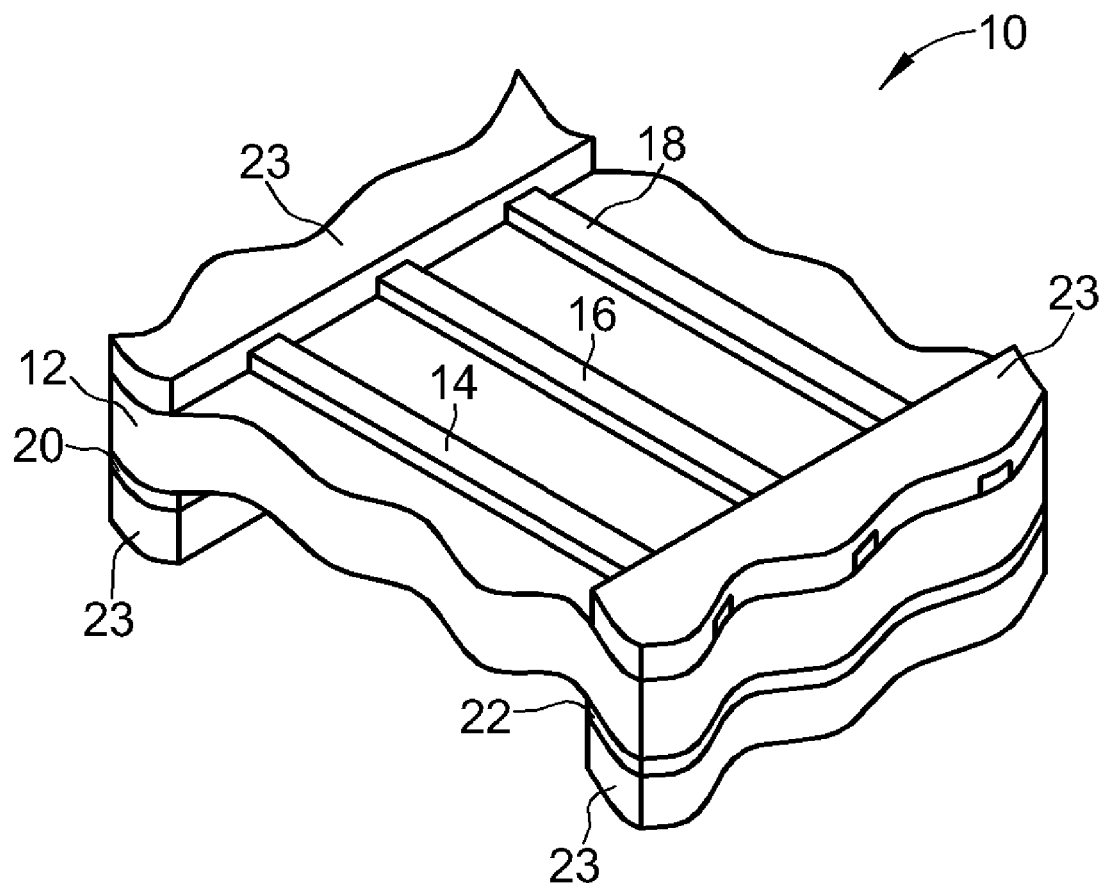
Figure 3:
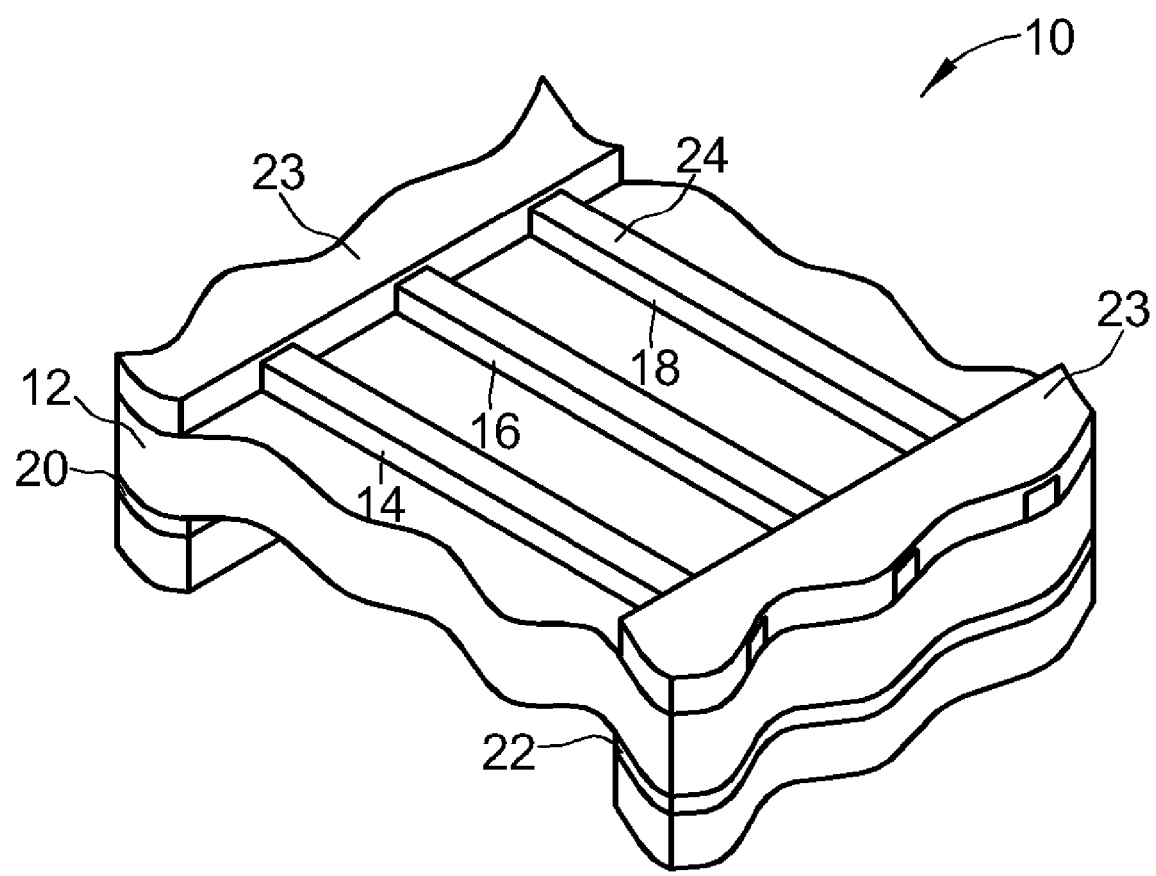
Figure 4:
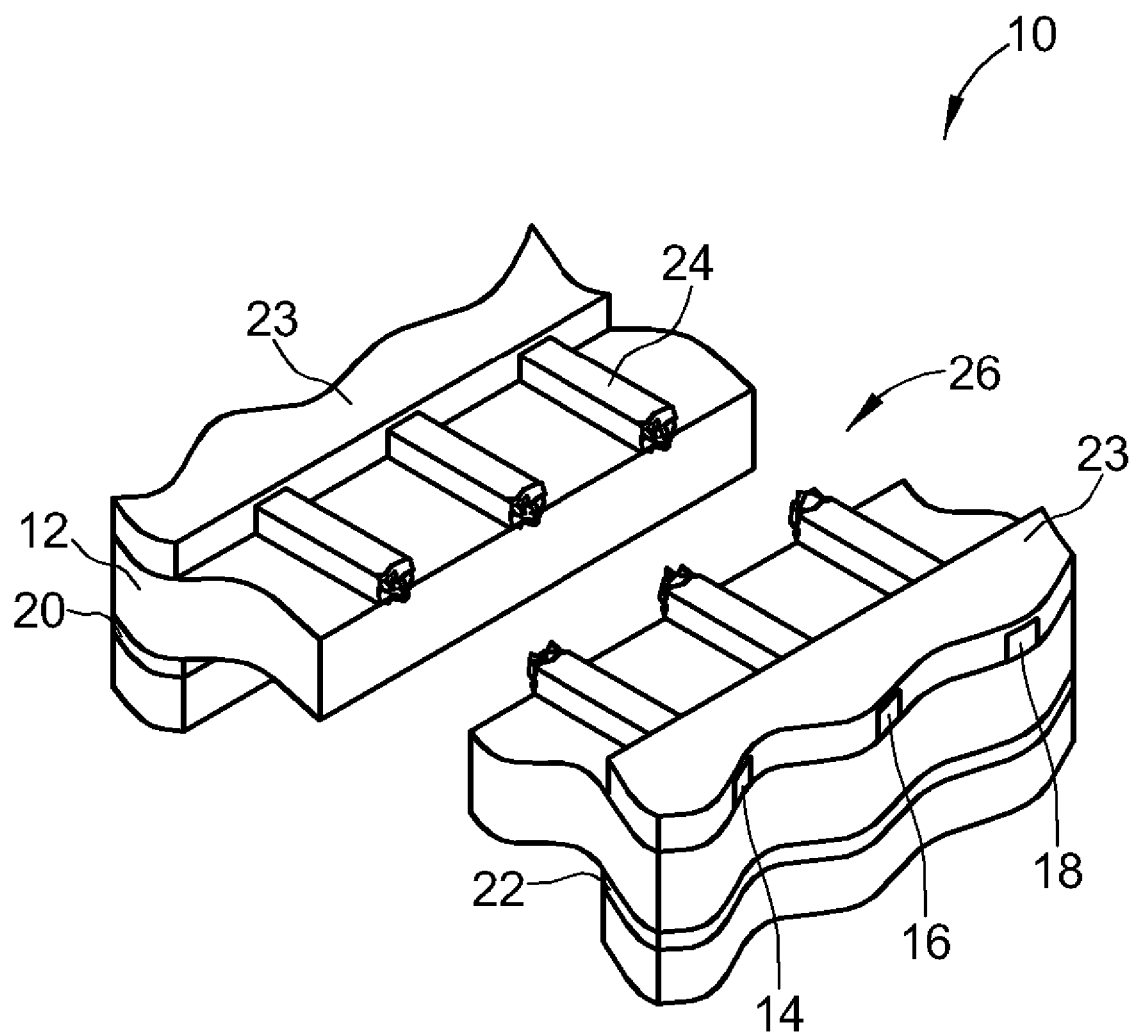
Figure 5:
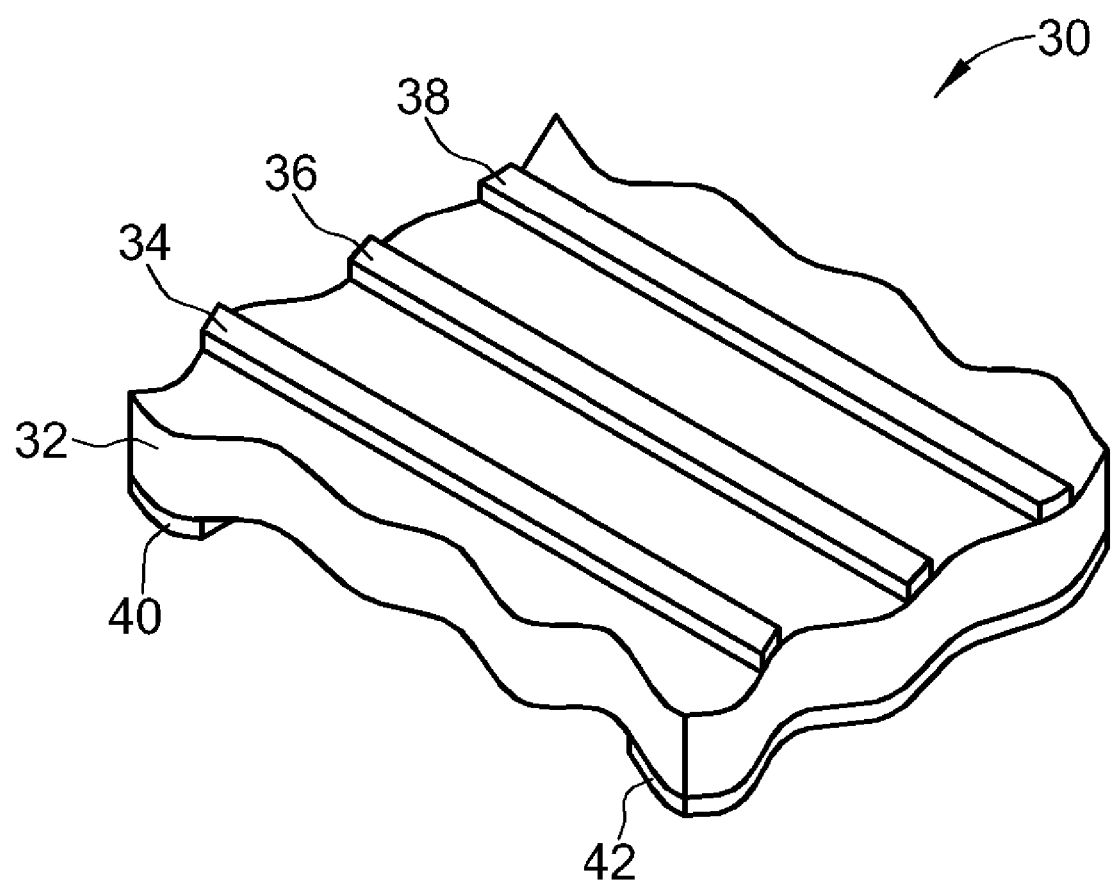
FIG. 5 to FIG. 10 are schematic diagrams for illustrating a method for cutting a printed circuit board according to the present invention.

Please refer to FIG. 5 to FIG. 10. FIG. 5 to FIG. 10 are schematic diagrams for illustrating a method for cutting a printed circuit board according to the present invention. As shown in FIG. 5, a printed circuit board 30 is provided. The printed circuit board 30, which is a multi-layer printed circuit board having undergone an internal circuit process, includes a substrate 32 and a plurality of metal conducting wires 34, 36, 38, 40, and 42 disposed on the substrate 32 surfaces. The substrate 32 can be fabricated by using a copper clad laminate (CCL) or an insulating substrate without an additional copper clad layer. For convenience of illustration, the present embodiment only displays the five metal conducting wires 34, 36, 38, 40, and 42 that are fabricated by a photolithography and etching process or a plating, photolithography, and etching process. The metal conducting wires 34, 36, 38, 40, and 42 are made of copper.

Figure 6:
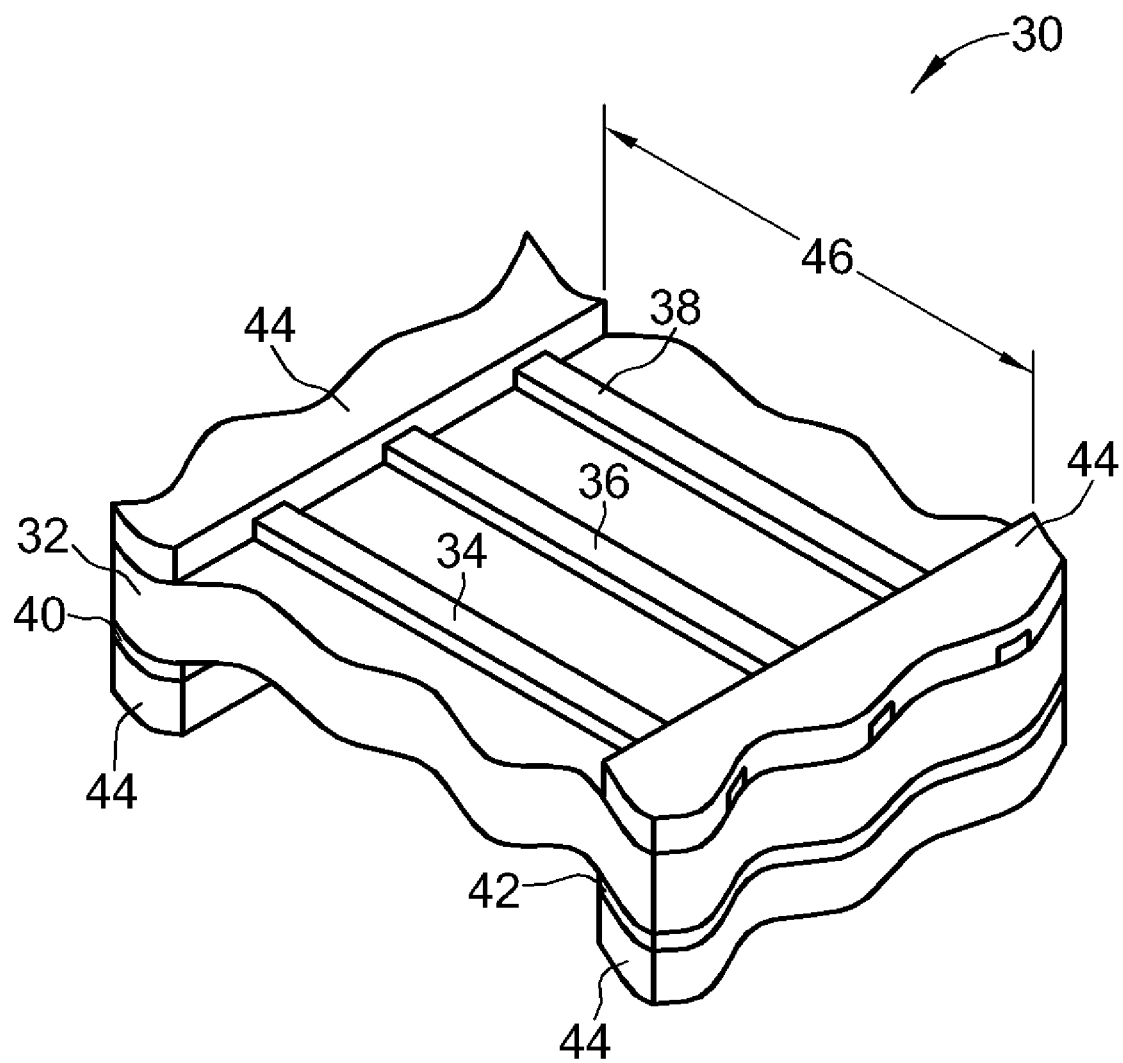

Please refer to FIG. 6. A first protection layer 44 is disposed on (i.e. coated onto) a portion of the lower and the upper surfaces of the printed circuit board 30 and disposed on a portion of the metal conducting wires 34, 36, 38, 40, and 42 to form a cutting region 46. The cutting region 46 includes the metal conducting wires 34, 36, and 38. The first protection layer 44 is selected from a group consisting of dry film, wet film, B-stage epoxy, and ultraviolet adhesive tape and is disposed onto the printed circuit board 30 surfaces by screen-printing, sticking, laminating, or other process. In the present embodiment, the first protection layer 44 is a wet film comprising a solder-resist ink layer and coated onto the printed circuit board 30 surfaces by screen-printing to cover a portion of the metal conducting wires 34, 36, 38, 40, and 42. An exposure and development process is performed to increase an adhesive force between the first protection layer 44 and the metal conducting wires 34, 36, 38, 40, and 42 by light polymerization, and then the first protection layer 44 indeed presses against and covers the metal conducting wires 34, 36, 38, 40, and 42.

Figure 7:
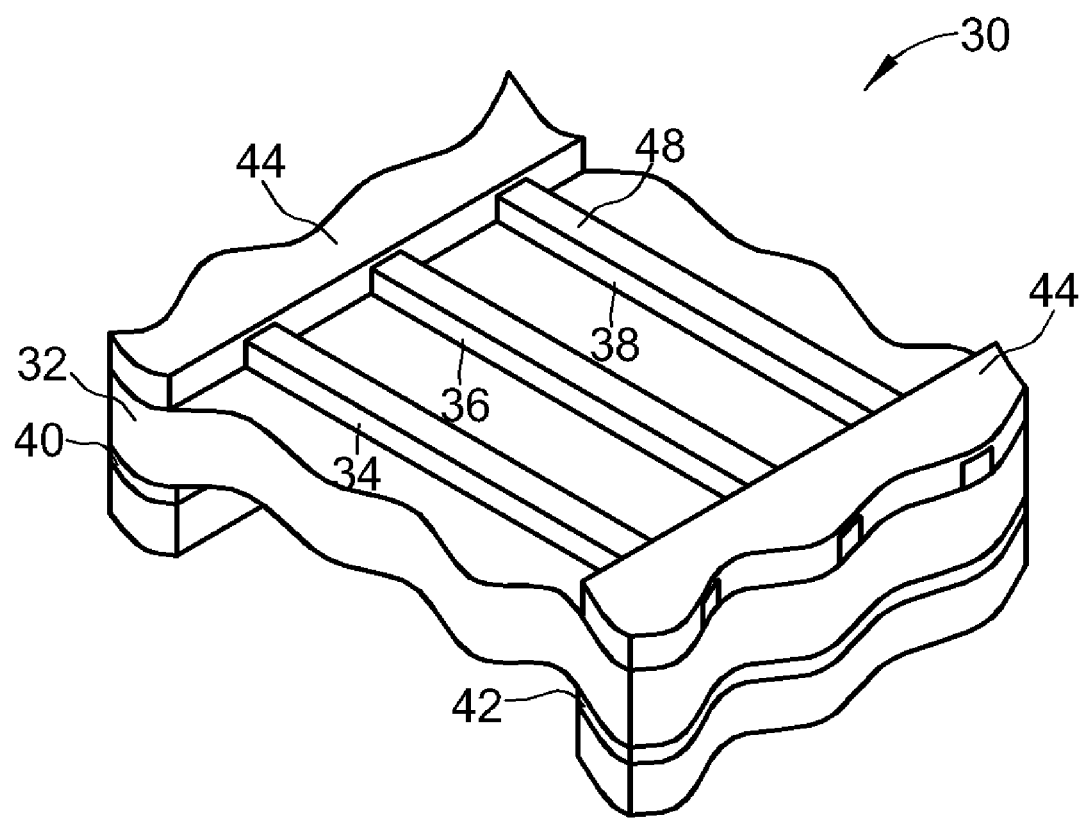

As shown in FIG. 7, a conducting layer 48, for example, comprising nickel (Ni) or gold (Au) is plated on the metal conducting wires 34, 36, 38, 40, and 42, which are not covered by the first protection layer 44 to enhance the corrosive resistance and increase the electric conductivity of the metal conducting wires 34, 36, 38, 40, and 42.

Figure 8:
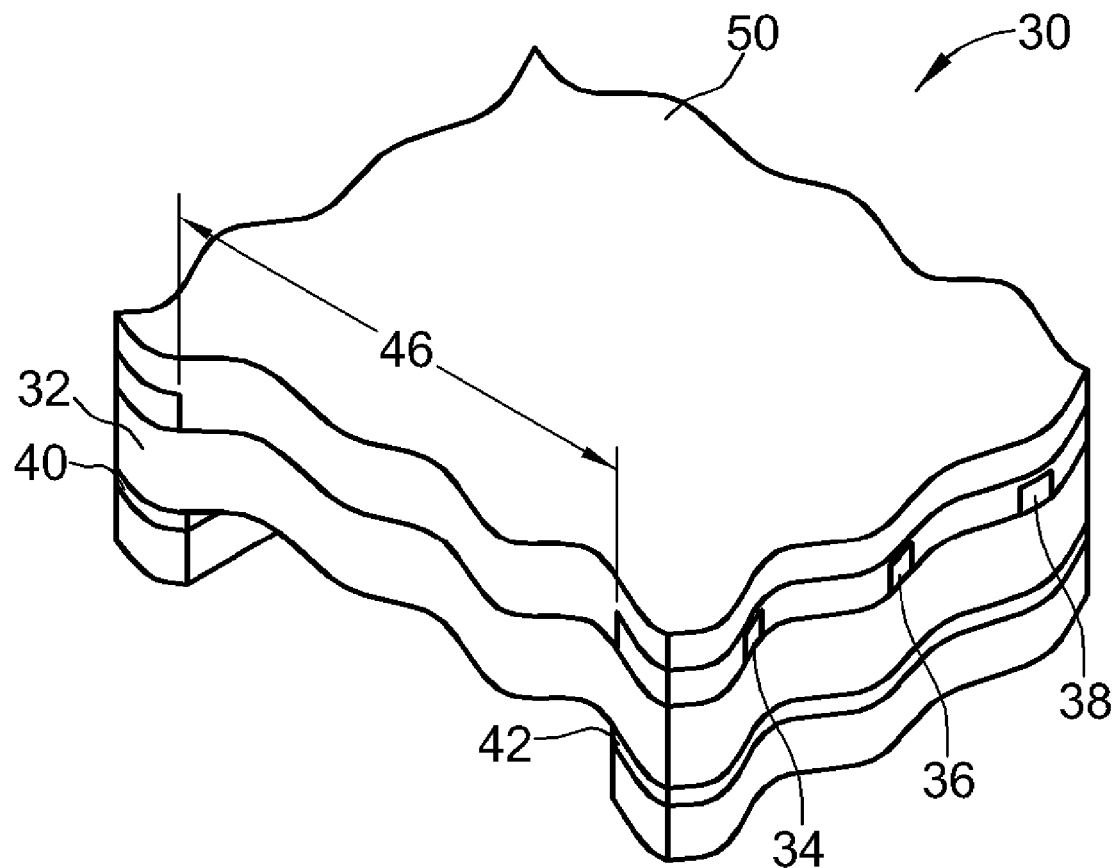

Please refer to FIG. 8. A second protection layer 50 is formed on the upper surface of the printed circuit board 30. The second protection layer 50 is disposed on the cutting region 46 completely coating it, and covers the metal conducting wire 34, 36, and 38, which will be cut. The second protection layer 50 is selected from the group consisting of dry film, wet film, B-stage epoxy, and ultraviolet adhesive tape and is disposed on the cutting region 46 by screen-printing, sticking, laminating, or other process. In the present embodiment, the second protection layer 50 is a wet film comprising a solder-resist ink layer and coated onto the cutting region 46 or a vicinity of the cutting region 46 by screen-printing to cover the exposed metal conducting wires 34, 36, and 38. An exposure and development process is performed to increase an adhesive force between the second protection layer 50 and the metal conducting wires 34, 36, 38, 40 and 42 by light polymerization, and then the second protection layer 50 indeed presses against and covers the metal conducting wires 34, 36, and 38 to prevent the metal conducting wires 34, 36, and 38 from being damaged during follow-up cutting.

Figure 9:
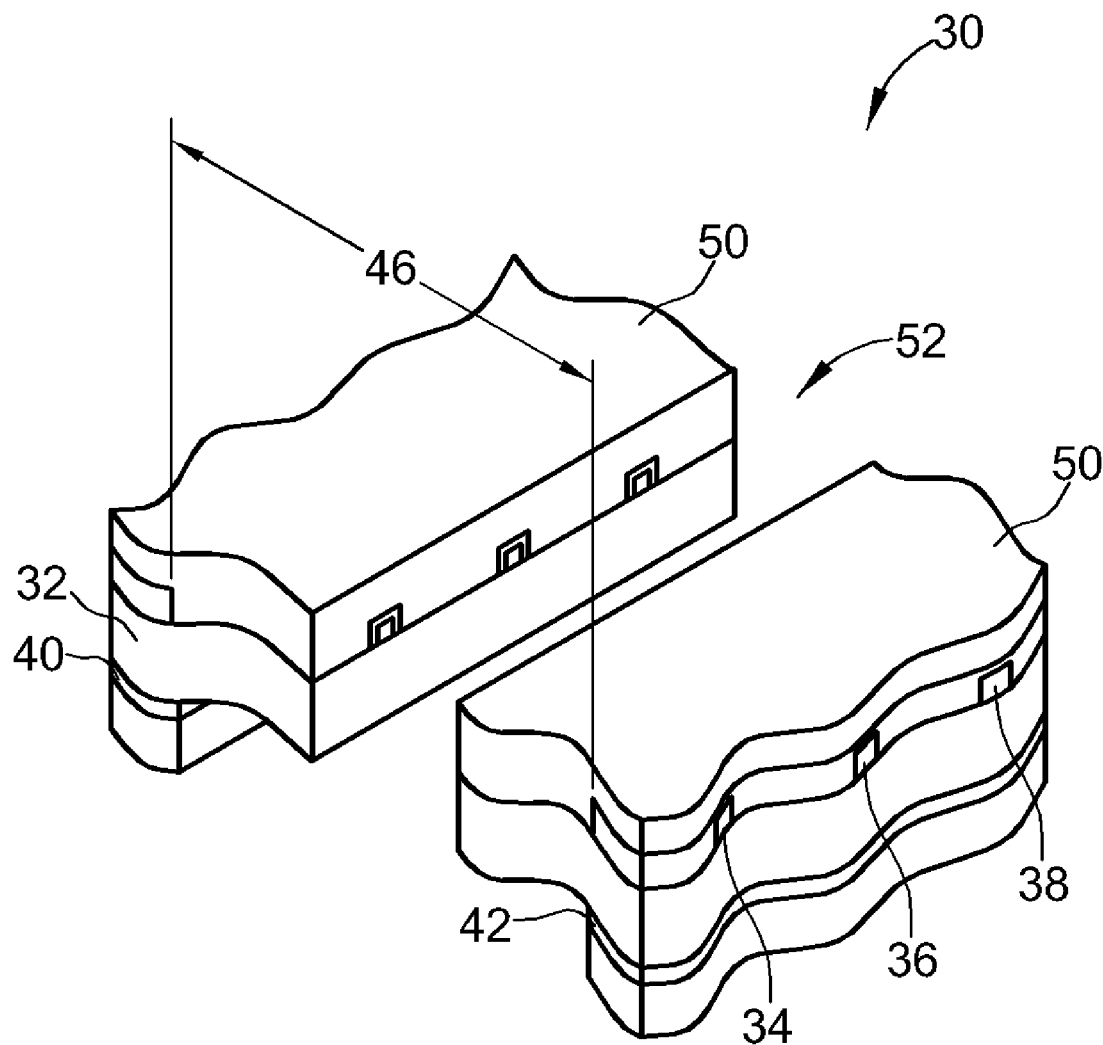

As shown in FIG. 9, a cutting process is performed in the cutting region 46 to cut off at least one of the metal conducting wires 34, 36, and 38 and separate the region of the printed circuit board 30 which is not covered by the first protection layer 44 and is electrically connected by the metal conducting wires 34, 36, and 38. According to the requirements of specific products, the printed circuit board 30 is separated to form two printed circuit boards or is cut to form a window in the printed circuit board 30. In the present embodiment, a window 52 is formed in the printed circuit board 30 by cutting, and the window 52 is a window of a load board of a WBGA packaged memory. The cutting process could be performed by a mill, a punch, or a blade according to the prior art. In the present embodiment, a mill is used for cutting. In the cutting process, since the second protection layer 50 indeed presses and covers the metal conducting wires 34, 36, and 38, portions of the metal conducting wires 34, 36, and 38 that are not cut are protected properly and the mill does not pull, drag, or damage the metal conducting wires 34, 36, and 38 to induce burrs.

Figure 10:
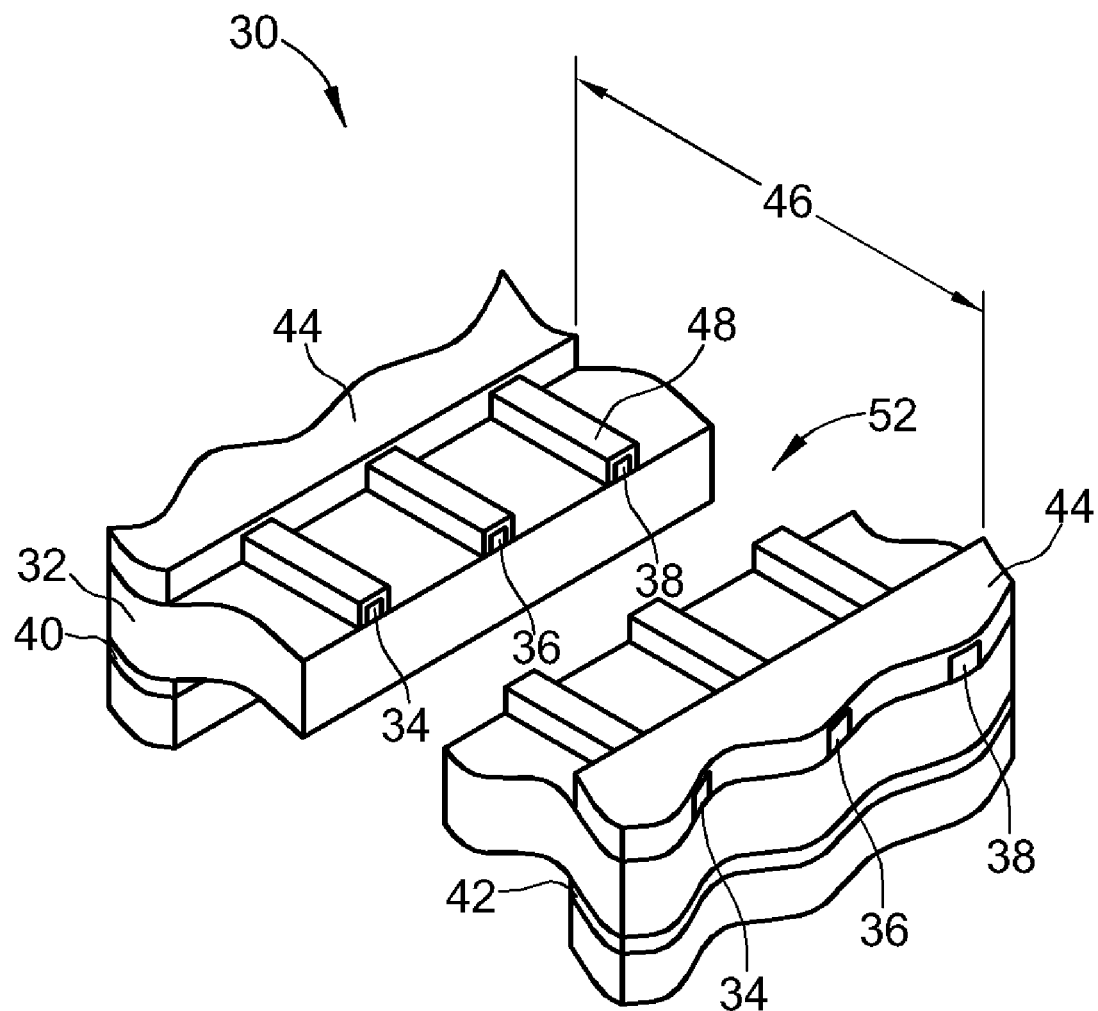

Please refer to FIG. 10. The protection layer 50 is removed by an etching or a stripping process to complete manufacturing a window 52 of the load board of the WBGA packaged memory. The metal conducting wires 34, 36, and 38 are contact pads of the load board of the WBGA packaged memory. In the present embodiment, since the second protection layer 50 is a solder-resist ink layer, which is hardened by light polymerization, it is easily striped by a prior art method to save manual labor in removing burrs, increase the yield, and reduce the production cost. Furthermore, since the second protection layer 50 can be removed, an appearance of a product made according to the present invention is not different from an appearance of a product made according to the prior art. It is noted that the second protection layer 50 can be completely removed or partially removed depending on the requirements of different products. The second protection layer 50 can be completely removed if the end user wants to preserve the inherent appearance of the product, or it can be partially removed if the end user does not care about the inherent appearance of the product but wants an additional protection layer to protect the contact pads. In the case that the second protection layer is partially removed, the removal exposes a portion of the contact pads, which will be bonded.

Compared to the prior art, since the present invention utilizes the second protection layer to cover the cutting region and press the metal conducting wires, burrs will be prevented while cutting. Furthermore, the second protection layer can be removed easily after the cutting process is finished. Therefore, the present invention is capable of increasing the quality of printed circuit boards, reducing manual labor in removing burrs, and reducing the production cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for cutting a printed circuit board, the method comprising:
    providing a printed circuit board, wherein a surface of the printed circuit board comprises at least a cutting region having a plurality of metal conducting wires;
    disposing a protection layer on the cutting region to prevent burrs in the metal conducting wires;
    performing a cutting process in the cutting region; and
    removing a portion of the protection layer after the cutting process is completed.

2. The method for cutting a printed circuit board of claim 1, wherein the metal conducting wires are contact pads of a load board of a window ball-grid-array packaged memory.

3. The method for cutting a printed circuit board of claim 1, wherein the protection layer is selected from a group consisting of dry film, wet film, B-stage epoxy, and ultraviolet adhesive tape.

4. The method for cutting a printed circuit board of claim 1, wherein the cutting process utilizes a mill, a punch, or a blade for cutting.

5. The method for cutting a printed circuit board of claim 1, wherein the cutting process cuts off at least one of the metal conducting wires.

6. The method for cutting a printed circuit board of claim 1, wherein the step for removing the protection layer utilizes a stripping process.

7. The method for cutting a printed circuit board of claim 1, wherein the step for removing the protection layer utilizes an etching process.

8. A method for cutting a printed circuit board, the method comprising:
    providing a printed circuit board, wherein a surface of the printed circuit board comprises at least a cutting region comprising a plurality of metal conducting wires disposed on the surface of the printed circuit board;
    disposing a patterned first protection layer on the printed circuit board and exposing the metal conducting wires in the cutting region;
    disposing a second protection layer on the cutting region to prevent burrs in the metal conducting wires;
    performing a cutting process in the cutting region; and
    removing a portion of the second protection layer after the cutting process is completed.

9. The method for cutting a printed circuit board of claim 8, wherein the metal conducting wires are contact pads of a load board of a window ball-grid-array packaged memory.

10. The method for cutting a printed circuit board of claim 8, wherein the protection layer is selected from a group consisting of dry film, wet film, B-stage epoxy, and ultraviolet adhesive tape.

11. The method for cutting a printed circuit board of claim 8, wherein the cutting process utilizes a mill, a punch or a blade for cutting.

12. The method for cutting a printed circuit board of claim 8, wherein the cutting process cuts off at least one of the metal conducting wires.

13. The method for cutting a printed circuit board of claim 8, wherein the step for removing the second protection layer utilizes a stripping process.

14. The method for cutting a printed circuit board of claim 8, wherein the step for removing the second protection layer utilizes an etching process.

* * * * *